(12) United States Patent
Or et al.

(10) Patent No.: US 7,298,060 B2
(45) Date of Patent: Nov. 20, 2007

(54) MAGNETOELECTRIC DEVICES AND METHODS OF USING SAME

(75) Inventors: Siu Wing Or, Hong Kong (CN); Helen Lai Wa Chan-Wong, Hong Kong (CN)

(73) Assignee: The Hong Kong Polytechnic University, Hong Kong SAR (CN)

( * ) Notice: Subject to any disclaimer, the term of this patent is extended or adjusted under 35 U.S.C. 154(b) by 0 days.

(21) Appl. No.: 11/708,318

(22) Filed: Feb. 21, 2007

(65) Prior Publication Data

US 2007/0145833 A1   Jun. 28, 2007

Related U.S. Application Data

(62) Division of application No. 10/814,265, filed on Apr. 1, 2004, now Pat. No. 7,199,495.

(51) Int. Cl.
*H02K 41/06* (2006.01)

(52) U.S. Cl. .......................... 310/26; 310/311; 318/118

(58) Field of Classification Search .................. 310/26, 310/311, 42–45; 318/118
See application file for complete search history.

(56) References Cited

U.S. PATENT DOCUMENTS

| | | | |
|---|---|---|---|
| 2,234,968 A | | 3/1941 | Hayes et al. |
| 3,004,176 A | | 10/1961 | Mason et al. |
| 3,401,377 A | | 9/1968 | Bartlett et al. |
| 3,533,860 A | * | 10/1970 | Kench et al. ............... 428/593 |
| 4,184,093 A | * | 1/1980 | Sullivan ..................... 310/331 |
| 6,168,860 B1 | * | 1/2001 | Daughton ................... 428/332 |
| 6,437,558 B2 | | 8/2002 | Li et al. |
| 2005/0104474 A1 | * | 5/2005 | Srinivasan .................. 310/311 |
| 2005/0194863 A1 | * | 9/2005 | Viehland et al. ............ 310/311 |

OTHER PUBLICATIONS

J. Van Den Boomgaard et al., A sintered magnetoelectric composite material $BaTiO_3$-$Ni(Co,Mn)$ $FE_2O_4$, Journal of Materials Science 13 (1978), Chapman and Hall ltd., printed in Great Britain pp. 1538-1548.

* cited by examiner

*Primary Examiner*—Thanh Lam
(74) *Attorney, Agent, or Firm*—Buchanan Ingersoll & Rooney PC

(57) ABSTRACT

The operational frequency of existing magnetoelectric materials having metallic or ceramic magnetostrictive materials and ceramic piezoelectric materials may be limited to a few kilohertz due to the presence of eddy-current losses in the metallic magnetostrictive phase. Further, these materials may be difficult to machine and fabricate due to their brittleness. Additionally, it may be difficult to tailor and optimize the properties (i.e., magnetoelectric voltage coefficient $\alpha_E$, etc.) of the devices. This invention provides a magnetoelectric element including at least one set of alternating piezoelectric layers and magnetostrictive composite layers. The magnetostrictive composite layer includes at least one magnetostrictive material dispersed in first concentrated zones within a first polymer matrix, wherein all of the concentrated zones are orientated along a first direction. It is found that the conversion efficiency (i.e., $\alpha_E$) varies in accordance with applied magnetic control field $H_{control}$.

3 Claims, 10 Drawing Sheets

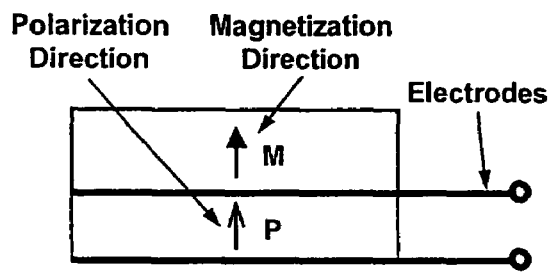
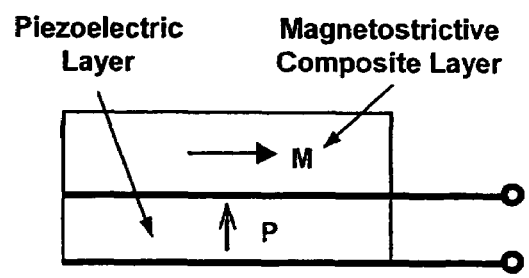
Fig. 3a
Fig. 3b
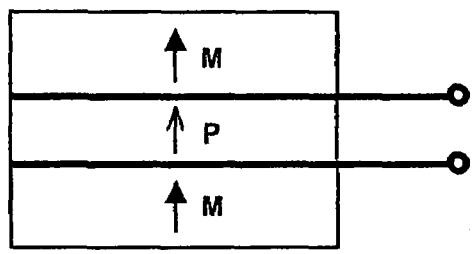
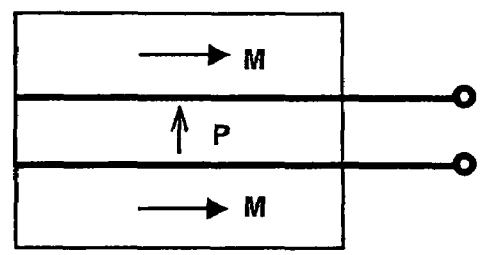
Fig. 3c
Fig. 3d
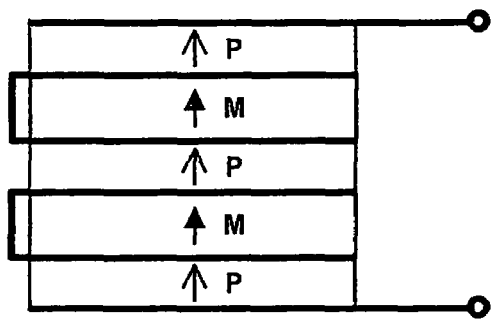
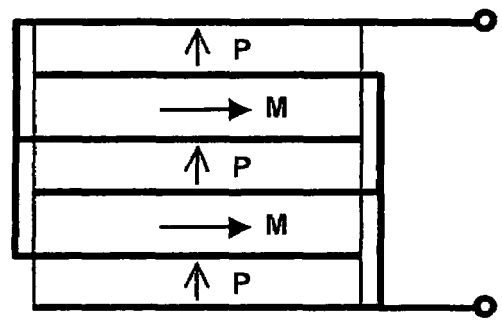
Fig. 3e
Fig. 3f
Fig. 3g
Figure 3.

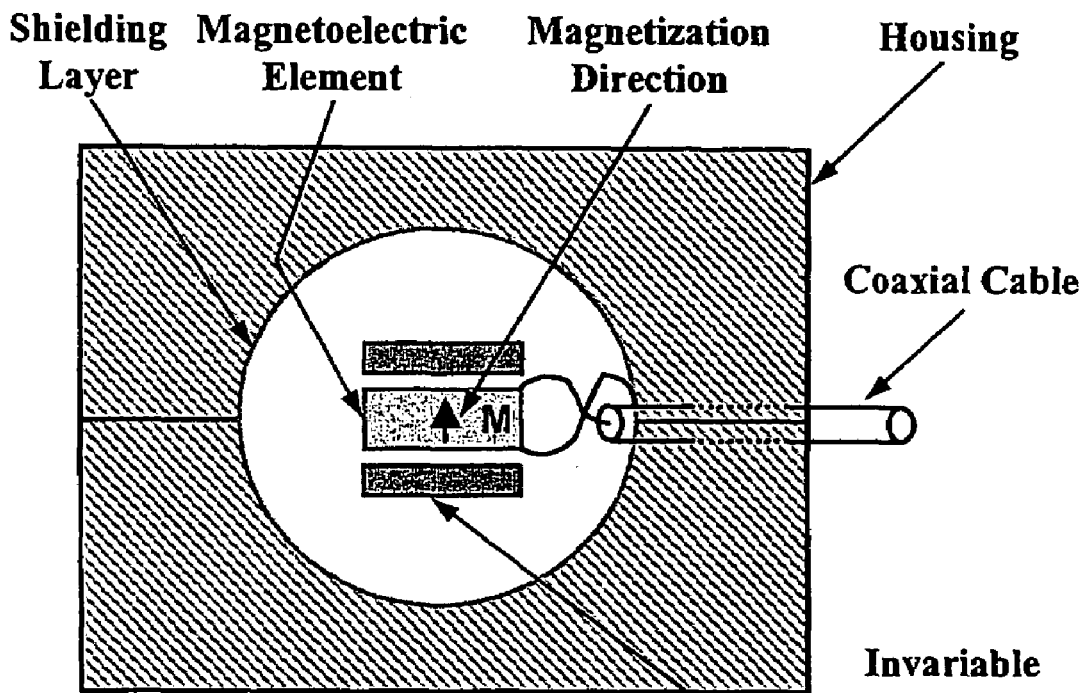
Fig. 4a
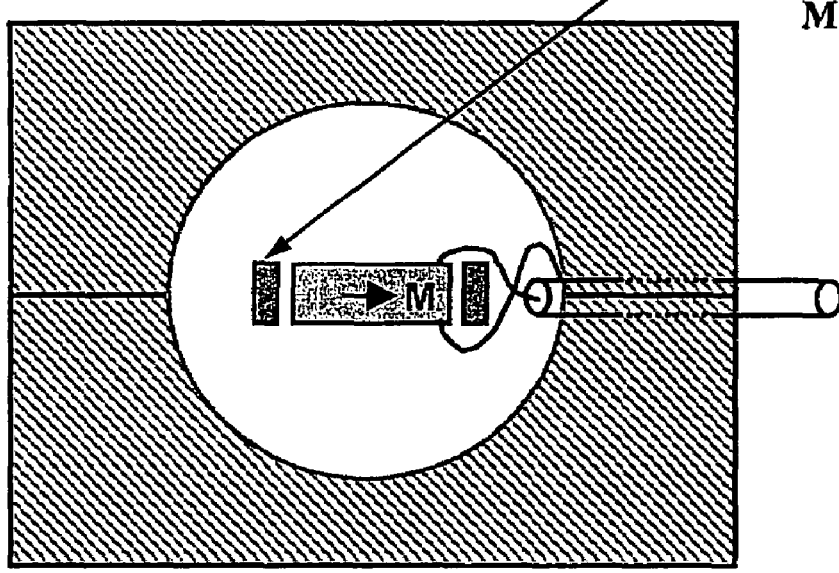
Fig. 4b
Figure 4.

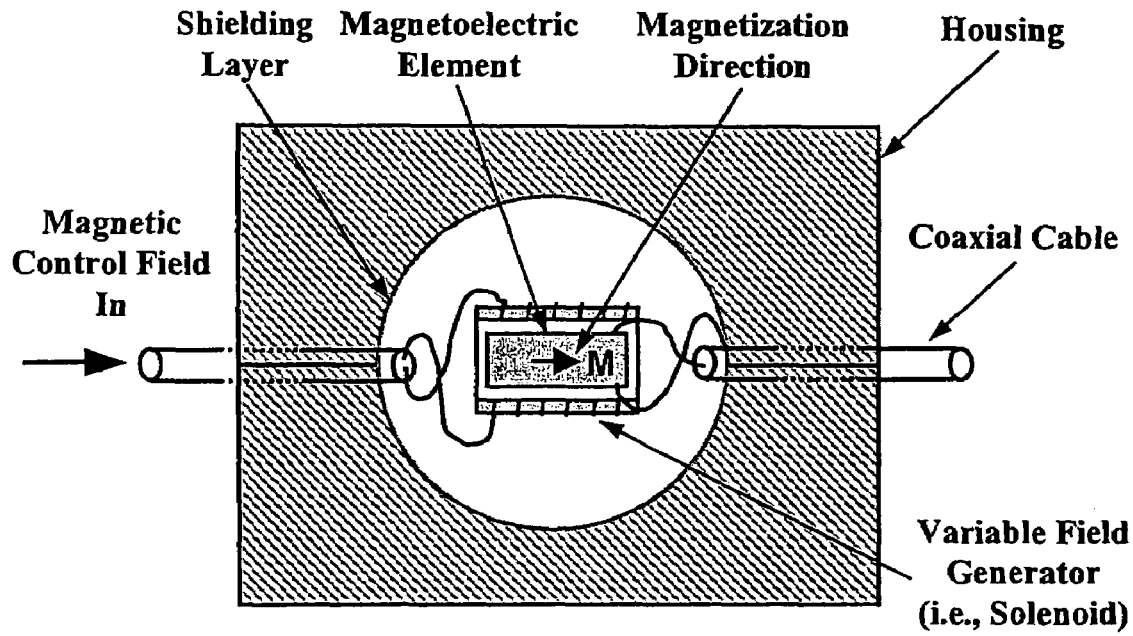
Fig. 5a
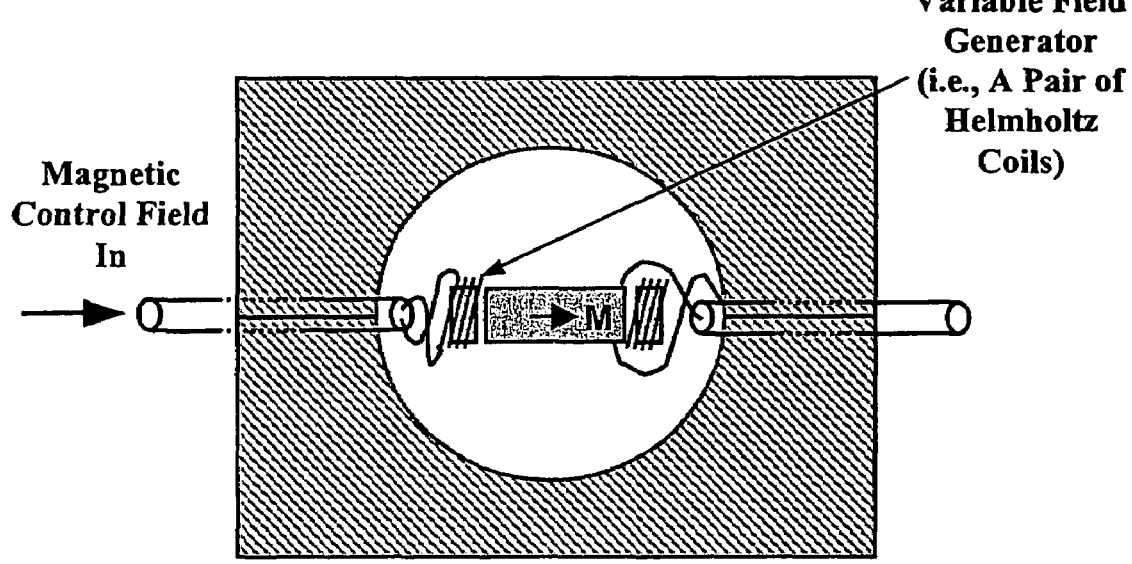
Fig. 5b
Figure 5.

MAGNETOELECTRIC DEVICES AND METHODS OF USING SAME

This application is a divisional of U.S. patent application Ser. No. 10/814,265 filed Apr. 1, 2004 now U.S. Pat. No. 7,199,495.

FIELD OF THE INVENTION

This invention relates to magnetoelectric devices, particularly those incorporating magnetostrictive composite.

BACKGROUND OF THE INVENTION

Common magnetic-field sensors for converting magnetic field to electric field signals include reluctance coils and Hall-effect devices. Reluctance coils generate an electric voltage proportional in magnitude to the time rate of change of magnetic flux coupling within the coils. To obtain an accurate measurement, a highly precise, low-noise, low-drift electronic integrator may be required to integrate the voltage signal induced across the coil. However, the lower the signal frequency (i.e., the lower the flux change rate), the longer the integration time is required, and below a certain signal frequency, the voltage signal disappears into the noise. Although Hall-effect devices do not suffer from these problems, they have limited. sensitivities (i.e., 5-50 µV/Oe) and are always hampered by a noise-induced bandwidth limitation to about 30 kHz. In addition, they require a highly stable constant-current source to establish an accurate Hall voltage output.

Magnetoelectric devices have received continuous attention due to their distinct advantage of providing a relatively simple, cost-effective and reliable means for direct-conversion of magnetic fields to electric fields and vice versa. Magnetoelectric effect is defined as a variation of dielectric polarization in a material when subjected to an applied magnetic field, or an induced magnetization in response to an external electric field. In recent years, several bulk and laminate magnetoelectric two-phase materials have been created to overcome the drawbacks of low operational temperatures and low magnetoelectric effect in single-phase materials.

Bulk materials may be represented by sintered 0-3 composites of magnetostrictive ferrite (i.e., a metal-iron-oxide ceramic) particles [e.g., cobalt ferrite (CFO or $CoFe_2O_4$), nickel ferrite (NFO or $NiFe_2O_4$), copper ferrite ($CuFe_2O_4$), manganese chromium ferrite ($MnFe_2Cr_{0.2}O_4$), cobalt zinc ferrite (CZFO), nickel zinc ferrite (NZFO), lithium zinc ferrite (LZFO), etc.] dispersed in a piezoelectric ceramic matrix [e.g., barium titanate ($BaTiO_3$), lead zirconate titanate (PZT), etc.] (J. van den Boomgaard and R. A. J. Born, "A Sintered Magnetoelectric Composite Material $BaTiO_3$—Ni $(Co,Mn)Fe_2O_4$", *J Mater. Sci.*, vol. 13, pp. 1538-1548, 1978). While these sintered bulk materials generally show a higher magnetoelectric voltage coefficient (i.e., $\alpha_E \sim 0.13$ V/cm·Oe, where $\alpha_E = dE/dH$ is the ratio of the change in electric field strength to the change in magnetic field strength) than single-phase materials (i.e., ~0.02 V/cm·Oe for $Cr_2O_3$), they still have some crucial problems in reproducibility and reliability impeding their commercial viability. These problems include: 1) difficulties in machining and fabricating devices due to the brittleness of the materials; 2) difficulties in controlling the connectivity of the constituent phases; 3) chemical reaction between phases during high-temperature sintering; 4) dielectric breakdown through the low electrically resistant magnetostrictive phase during poling of the piezoelectric phase under a high electric poling field to induce an electric polarization; and 5) weak mechanical coupling between phases owing to processing-induced mechanical defects (i.e., pores, cracks, etc.).

Laminate materials may include bilayer, sandwich and multilayer structures of either magnetostrictive metal plates/disks [e.g., terbium-dysprosium-iron alloy (Terfenol-D), iron (Fe), cobalt (Co), nickel (Ni), etc.] or magnetostrictive ferrite plates/disks (e.g., CFO, NFO, CZFO, NZFO, LZFO, etc.) and piezoelectric ceramic plates/disks [e.g., $BaTiO_3$, PZT, lead magnesium niobate-lead titanate (PMN-PT), lead zirconate niobate-lead titanate (PZN-PT), etc.] (W. N. Podney, "Composite Structured Piezomagnetometer", U.S. Pat. No. 5,675,252, 7 Oct. 1997). Among these laminate structures, the ones incorporating Terfenol-D, a magnetostrictive rare-earth-based alloy of terbium (Tb), dysprosium (Dy) and iron (Fe), exhibit the greatest magnetoelectric voltage coefficient $\alpha_E$. This may be due to the giant magnetostrictive strain (i.e., ~1200 ppm) produced by Terfenol-D in comparison with other magnetostrictive materials (i.e., only on an order of 10 ppm). An effective mechanical coupling between the magnetostrictive and piezoelectric phases related to simple structure and simple fabrication technique (i.e., bonding all well-prepared constituent layers together) plays another key factor to produce the high magnetoelectric voltage coefficient $\alpha_E$.

As the development of magnetoelectric materials so far relies on the use of metallic or ceramic magnetostrictive materials and ceramic piezoelectric materials as their constituent phases, this leads to three significant problems in the resulting magnetoelectric devices. The first is the limitation of the operational frequency to a few kilohertz due to the presence of eddy-current losses in the low electrically resistant metallic magnetostrictive phase (i.e., electrical resistivity~0.6 $\mu\Omega \cdot m$ for Terfenol-D). The second is difficulties in machining and fabricating devices owing to the mechanical brittleness of the ceramic and some metallic (i.e., Terfenol-D, etc.) magnetostrictive phases as well as of the ceramic piezoelectric phase. The third is difficulties in tailoring and optimizing the properties (i.e., magnetoelectric voltage coefficient $\alpha_E$, operational frequency range, etc.) of the devices due to the limitation of the types of the constituent materials. Particularly, the problem arisen from eddy-current losses may have reduced the commercial and practical values of currently available magnetoelectric devices, since their operational frequencies (i.e., a few kilohertz only) are even lower than those of traditional Hall-effect devices (i.e., ~30 kHz). This problem, together with that caused by limitation of materials' types, may have restricted the existing magnetoelectric devices to be only used as a low-frequency sensor or a low-frequency transducer.

OBJECTS OF THE INVENTION

Therefore, it is an object of this invention to provide a magnetoelectric device and magnetoelectric composite that may resolve at least a portion of the above problems. As a minimum, it is an object of this invention to provide the public with a useful choice.

SUMMARY OF THE INVENTION

Accordingly, this invention provides a magnetoelectric element including at least one set of alternative piezoelectric layer and magnetostrictive composite layer. The magnetostrictive composite layer includes at least one magnetostrictive material dispersed in first concentrated zones within a first polymer matrix, wherein all of said concentrated zones are orientated along a first direction.

Preferably, the magnetostrictive material is a rare-earth-based alloy. More preferably, the rare-earth-based alloy is selected from the group consisting of terbium-dysprosium-iron alloy (Terfenol-D), gallium-iron alloy (Gafenol), and samarium-dysprosium-iron alloy (Samfenol-D). The first polymer matrix is preferred to be made of a first polymer selected from the group consisting of thermosetting polymer and thermoplastic polymer.

Preferably, the piezoelectric layer is selected from the group consisting of piezoelectric polymer and piezoelectric composite.

Advantageously, the piezoelectric polymer is selected from the group consisting of polyvinylidene fluoride (PVDF) polymer and polyvinylidene fluoride-trifluoroethylene [P(VDF-TrFE)] copolymer.

Alternatively, the piezoelectric composite includes at least one piezoelectric material dispersed in second concentrated zones within a second polymer matrix, wherein all of said concentrated zones are orientated along a second direction. More preferably, the piezoelectric material is selected from the group consisting of barium titanate ($BaTiO_3$), lead zirconate titanate (PZT), lead magnesium niobate-lead titanate (PMN-PT) and lead zirconate niobate-lead titanate (PZN-PT), while the second polymer matrix is preferred to be made of a second polymer selected from the group consisting of thermosetting polymer, thermoplastic polymer, polyvinylidene fluoride (PVDF) polymer and polyvinylidene fluoride-trifluoroethylene [P(VDF-TrFE)] copolymer.

It is another aspect of this invention to provide a magnetoelectric device including at least one magnetoelectric element as described and at least one field generator for generating a magnetic field. The magnetoelectric element is positioned in the magnetic field.

Preferably, the field generator is an invariable field generator. More preferably, a further second variable field generator is included to generate a variable magnetic control field.

Alternatively, the field generator is a variable field generator to generate a variable magnetic control field.

It is another aspect of this invention to provide a method of controlling at least the magnetoelectric voltage coefficient $\alpha_E$ of a magnetoelectric device including a magnetoelectric element, said magnetoelectric element including at least one set of alternative piezoelectric layer and magnetostrictive composite layer, wherein:

the magnetostrictive composite layer includes at least one magnetostrictive material dispersed in first concentrated zones within a first polymer matrix, wherein all of said concentrated zones are orientated along a first direction; and positioned in a magnetic field generated by a variable field generator including the step of varying the magnetic field.

Preferably, the magnetoelectric device has a resonance frequency region, and the magnet control field is varied within the resonance frequency region. More preferably, the resonance frequency region is about 45 to 85 kHz.

BRIEF DESCRIPTION OF THE DRAWINGS

Preferred embodiments of the present invention will now be explained by way of example and with reference to the accompanying drawings in which:

FIG. 3 shows some configurations of a magnetoelectric element for the magnetoelectric devices of this invention;

FIG. 4 shows an example of a single-element magnetoelectric device of this invention in sensor mode;

FIG. 5 shows an example of a single-element magnetoelectric device of this invention in transducer or combo mode;

DETAILED DESCRIPTION OF THE PREFERRED EMBODIMENT

This invention is now described by way of example with reference to the figures in the following paragraphs.

Objects, features, and aspects of the present invention are disclosed in or are obvious from the following description. It is to be understood by one of ordinary skill in the art that the present discussion is a description of exemplary embodiments only, and is not intended as limiting the broader aspects of the present invention, which broader aspects are embodied in the exemplary constructions.

Figure 1:
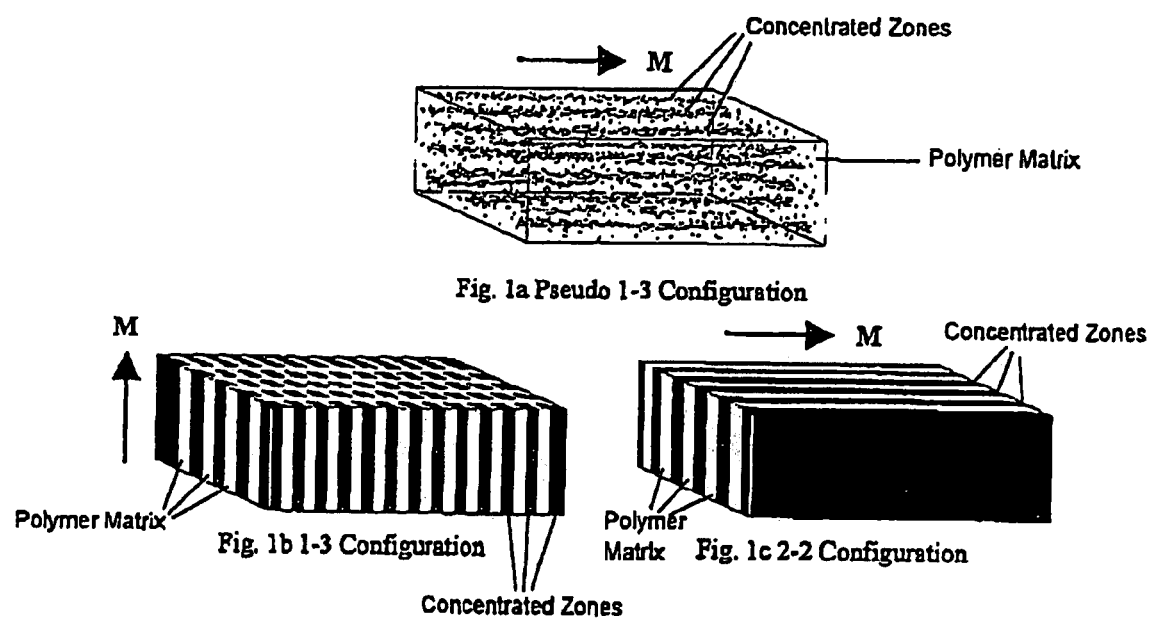
FIG. 1 shows different configurations of a low-eddy-current-loss, high-compliance magnetostrictive composite for the magnetoelectric devices of this invention.

FIG. 1 shows different configurations of a low-eddy-current-loss, high-compliance magnetostrictive composite for the magnetoelectric devices according to the invention. The magnetostrictive composite is preferred to be made of a magnetostrictive material of rare-earth-based alloy [e.g., terbium-dysprosium-iron alloy (Terfenol-D), gallium-iron alloy (Gafenol), samarium-dysprosium-iron alloy (Samfenol-D), etc.] dispersed in a polymer matrix that is passive to magnetic and electric fields. For example, thermosetting polymer [e.g., epoxy, phenolic, unsaturated polyester (UP), etc.] and thermoplastic polymer [e.g., polycarbonate (PC), polystyrene (PS), polymethyl methacrylate (PMMA), polyimide (PI), unpoled polyvinylidene fluoride (unpoled PVDF), unpoled polyvinylidene fluoride-trifluoroethylene [unpoled P(VDF-TrFE)], etc.] may be used. Different forms of dispersion are possible. For example, at least parts of Terfenol-D may be separated from one another by a part of epoxy. FIGS. 1a to 1c show a composite magnetostrictive layer in some of the other possible configurations. These composites in turn include, but are not limited to, pseudo 1-3 (i.e., magnetostrictive particles are aligned longitudinally in the polymer matrix), 1-3 (i.e., polymer layers are extended transversely in an orthogonal direction) and 2-2 (i.e., polymer layers are extended transversely in a single direction) configurations. Generally, the magnetostrictive material is dispersed in concentrated zone within the polymer matrix, and such concentrated zones are aligned along a direction M to create a preferred magnetization (M) axis as indicated in FIGS. 1a to 1c. For pseudo 1-3 configuration, the alignment of magnetostrictive particles may be achieved using a fixed dc magnetic field generated by a pair of permanent magnets or an electromagnet. For 1-3 and 2-2 configurations, the alignment may be accomplished by cutting the monolithic magnetostrictive material into parts and then combining and laminating the parts to create a preferred M axis.

It should be noted that ceramic magnetostrictive materials can also be fabricated into the composite form to reduce their intrinsic brittleness problem. For both metal- and ceramic-based magnetostrictive composites, their properties can be tailored to suit specific application requirements by changing the volume fractions of their constituent phases. This tailorable capability significantly enhances the importance of composites in magnetoelectric applications.

Though useful, monolithic magnetostrictive rare-earth-based alloys, being metals, generally have two disadvantages. Firstly, the operational frequency is limited to a few kilohertz due to the presence of eddy-current losses. Secondly, it may be difficult to machine and fabricate devices owing to the brittleness of the material. By dispersing and aligning the magnetostrictive materials into a polymer matrix, for instance by fabricating the monolithic materials into a composite form comprising two or more monolithic parts separated from one another by at least a part of passive polymer, the materials' bandwidths can conveniently be extended into the ultrasonic regime (i.e., $\geq 20$ kHz) and their brittleness can significantly be reduced due to increased electrical resistivity and mechanical durability, respectively.

Figure 2:
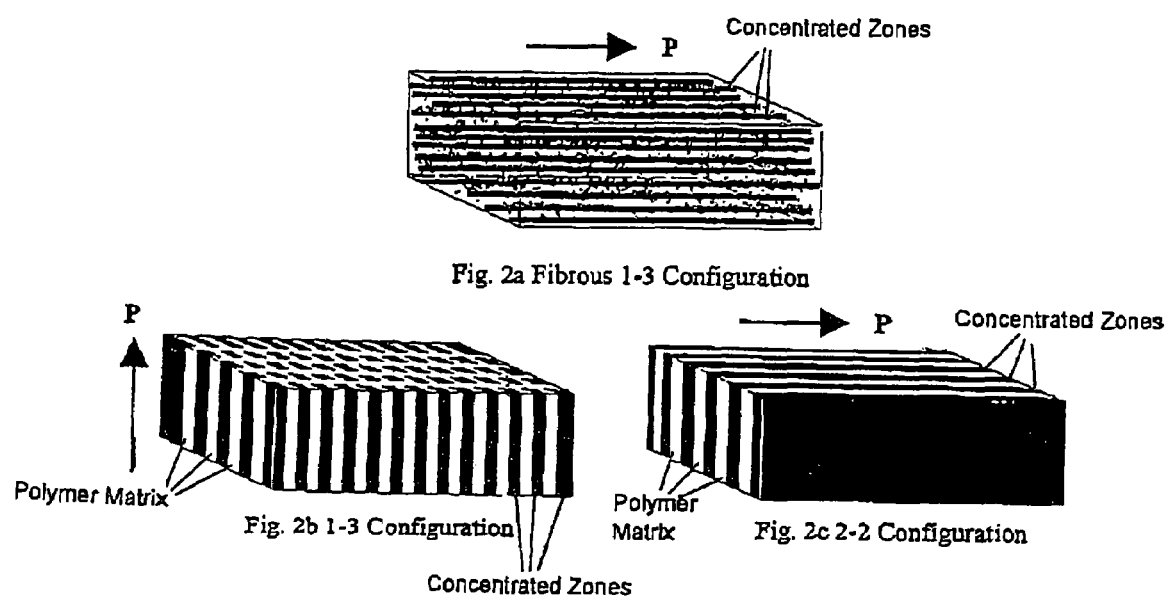
FIG. 2 shows different configurations of a high-compliance piezoelectric composite for the magnetoelectric devices according to this invention.

To alleviate the mechanical brittleness problem in ceramic piezoelectric phase, a higher compliance piezoelectric material is used. This includes piezoelectric polymers [e.g., polyvinylidene fluoride (PVDF) polymer, polyvinylidene fluoride-trifluoroethylene [P(VDF-TrFE)] copolymer, etc.] and piezoelectric composites comprising a piezoelectric ceramic [e.g., barium titanate ($BaTiO_3$), lead zirconate titanate (PZT), lead magnesium niobate-lead titanate (PMN-PT), lead zirconate niobate-lead titanate (PZN-PT), etc.] dispersed in a polymer matrix that is either a polymer passive to magnetic and electric fields [e.g., epoxy, phenolic, unsaturated polyester (UP), polycarbonate (PC), polystyrene (PS), polymethyl methacrylate (PMMA), polyimide (PI), unpoled polyvinylidene fluoride (unpoled PVDF), unpoled polyvinylidene fluoride-trifluoroethylene [unpoled P(VDF-TrFE)], etc.] or a piezoelectric polymer [e.g., PVDF, P(VDF-TrFE), etc.]. For example, two or more piezoelectric PZT parts may be separated from one another by a part of epoxy. FIGS. 2a to 2c show a composite piezoelectric layer in some of the different configurations. These composites in turn include, but are not limited to, fibrous 1-3 (i.e., piezoelectric fibers are aligned longitudinally in the polymer matrix), 1-3 (i.e., polymer layers are extended transversely in an orthogonal direction) and 2-2 (i.e., polymer layers are extended transversely in a single direction) configurations. Generally, the piezoelectric ceramic is dispersed in concentrated zone within the polymer matrix, and such concentrated zones are aligned along a direction P to create a preferred polarization (P) axis as indicated in FIGS. 2a to 2c. The properties of the composite piezoelectric materials can be tailored to optimally match with the magnetostrictive phase for magnetoelectric applications, as for the above composite magnetostrictive materials.

FIG. 3 shows some of the possible configurations of a magnetoelectric element for the magnetoelectric devices according to the invention. It should be noted that any shape is possible even though a rectangular shape is shown. FIGS. 3a and 3b show bilayer configurations with the magnetization (M) and polarization (P) axes along the same direction and perpendicular to each other, respectively. These suggest that the magnetostrictive and piezoelectric phases are subject to the thickness magnetization and thickness polarization, respectively, in FIG. 3a, while those experience longitudinal magnetization and thickness polarization, respectively, in FIG. 3b. FIGS. 3c and 3d show the sandwich configurations with the M and P axes along the same direction (i.e., thickness magnetization and thickness polarization) and perpendicular to each other (i.e., longitudinal magnetization and thickness polarization), respectively. FIGS. 3e and 3f illustrate two mixed types of multilayer configurations. In FIG. 3e, mechanically the element is in the 2-2 configuration but electrically it is in the series configuration. Since the major surfaces of the magnetostrictive layers are electrically shorted, they are effectively bypassed in the electrical circuit and the piezoelectric properties of the whole element remain unchanged. In FIG. 3f, mechanically it is a 2-2 element but electrically it is a parallel element. FIG. 3g shows an element having a longitudinally magnetized magnetostrictive phase and a thickness-poled piezoelectric phase combined along their longitudinal direction.

A magnetoelectric device of this invention in sensor mode is shown in FIG. 4, which includes a magnetoelectric element, an invariable field generator and, optionally a housing. This device is capable of detecting and measuring magnetic fields and electric currents over a wide range of frequencies up to its fundamental resonance frequency. Both of the magnetoelectric element and the invariable field generator are optionally encapsulated in housing made of a nonmagnetic material. Potential candidates include passive ceramics, polymers, composites and some metals, such as stainless steel 304, titanium alloys, aluminum alloys, or the like. The inside of the housing, which contains the magnetoelectric element-invariable field generator assembly, is preferably but not exclusively a sphere on which a thin metal layer is deposited for shielding any interference due to stray electric fields (i.e., but it should be transparent to magnetic fields). This shielding layer is preferably aluminum, or the like. The thickness of the layer depends on the desired frequency range of operation; for instant, a 200-nm-thick aluminum layer is used for frequencies up to 1 MHz. The layer has electrical contact to ground through the braiding of the coaxial cable.

The invariable field generator is preferably, but is not limited to, a pair of permanent magnets. This permanent magnet pair, which situates near both ends of the magnetoelectric element, provides an invariable magnetic field (i.e., a fixed dc magnetic field) along the desired operational direction of the device so as to maximize the device performance. That is, along the magnetization (M) axis of the magnetostrictive phase in the magnetoelectric element, but this will be considered as a design option. Depending on the configuration of the magnetoelectric element, this permanent magnet pair can be positioned vertically (FIG. 4a), horizontally (FIG. 4b), and so on. The permanent magnets are preferably but not exclusively monolithic sintered or polymer-bonded neodymium iron boron (NdFeB) and samarium cobalt (SmCo) magnets. Sintered magnets have higher magnetic properties and better thermal stability, while polymer-bonded magnets provide higher electrical resistivity (i.e., they are less susceptible to eddy-current losses) and lower density. If sintered magnets are employed, it is preferably to provide some slits in the magnets so as to minimize the eddy-currents accumulating on their major surfaces. The electrical leads of the magnetoelectric element form a parasitic pick-up loop, the influence of which needs to be minimized for magnetic fields in the direction normal to the lateral side of the element. The output of the device is an electrical signal having amplitude and frequency proportional to and the same as the detected magnetic field signal, respectively.

A magnetoelectric single-element device in transducer or combo mode is shown in FIG. 5, which has a structure similar to that in sensor mode as shown in FIG. 4, except that the invariable field generator is replaced by a variable field generator. This variable field generator aims to provide a variable magnetic control field (i.e., a "tunable" dc magnetic field) to the magnetoelectric element so that the device performance, such as the conversion efficiency (i.e., the magnetoelectric voltage coefficient $\alpha_E$), operational frequency (i.e., resonance frequency), etc., can be adjusted by varying the magnitude of this externally applied magnetic control field. This unique feature makes the device to be useful in "tunable" magnetoelectric sensor when operating in its non-resonance frequency ranges (i.e., sensor mode), in "tunable" magnetoelectric transducer (i.e., resonator, filter, switch, etc.) when operating in its resonance frequency ranges, and in "tunable" magnetoelectric combo device when operating in its full frequency range. The said variable field generator is preferably but not exclusively an electromagnetic coil in form of a solenoid (FIG. 5a), a pair of Helmholtz coils (FIG. 5b), or the like. Similar to the case of invariable field generator in FIG. 4, the applied magnetic control field has to be along the desired operational direction of the device [i.e., along the magnetization (M) axis of the magnetostrictive phase in the magnetoelectric element] so as to maximize the device performance, but this will be considered as a design option. The electromagnetic coils can have any dimensions and any number of turns of enamelled metal wire (i.e., enamelled copper wire) in one or more layers, as desired.

Figure 6:
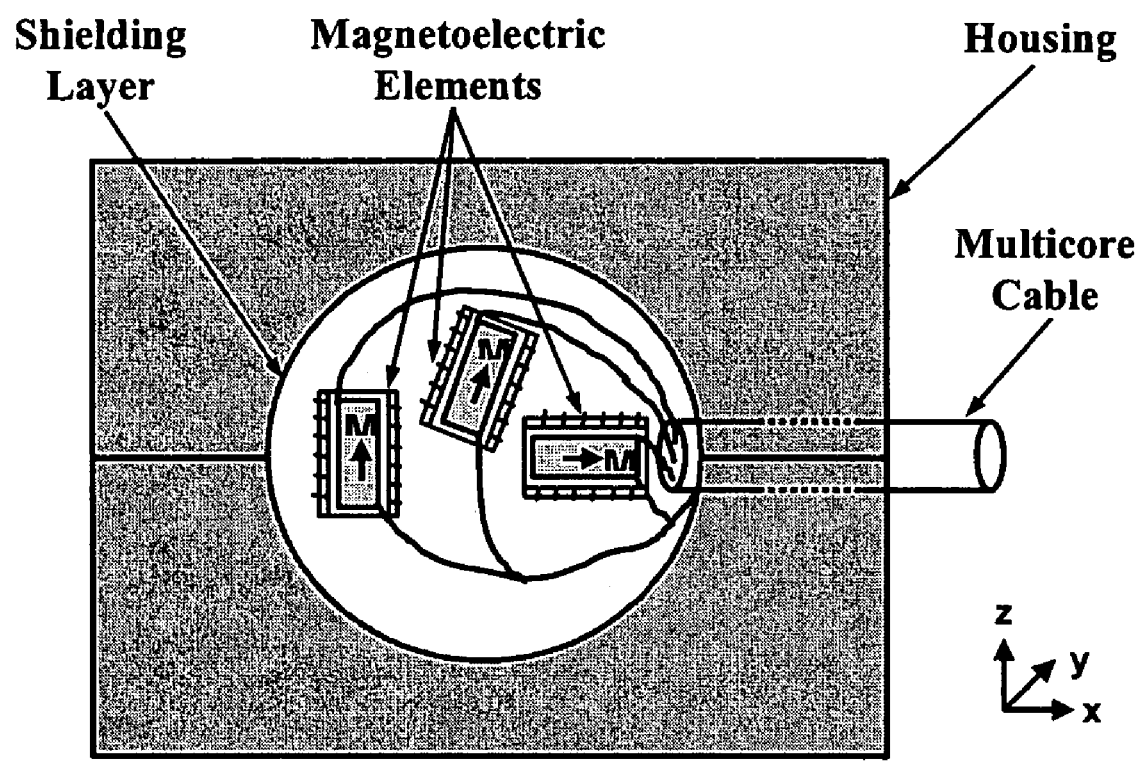
FIG. 6 shows an example multiple-element magnetoelectric device according to the invention.

FIG. 6 illustrates an example of multiple-element magnetoelectric device according to the invention. A number of magnetoelectric element-field generator pairs are arranged in a single housing to provide multichannel detection, measurements and/or field conversions.

Figure 7:
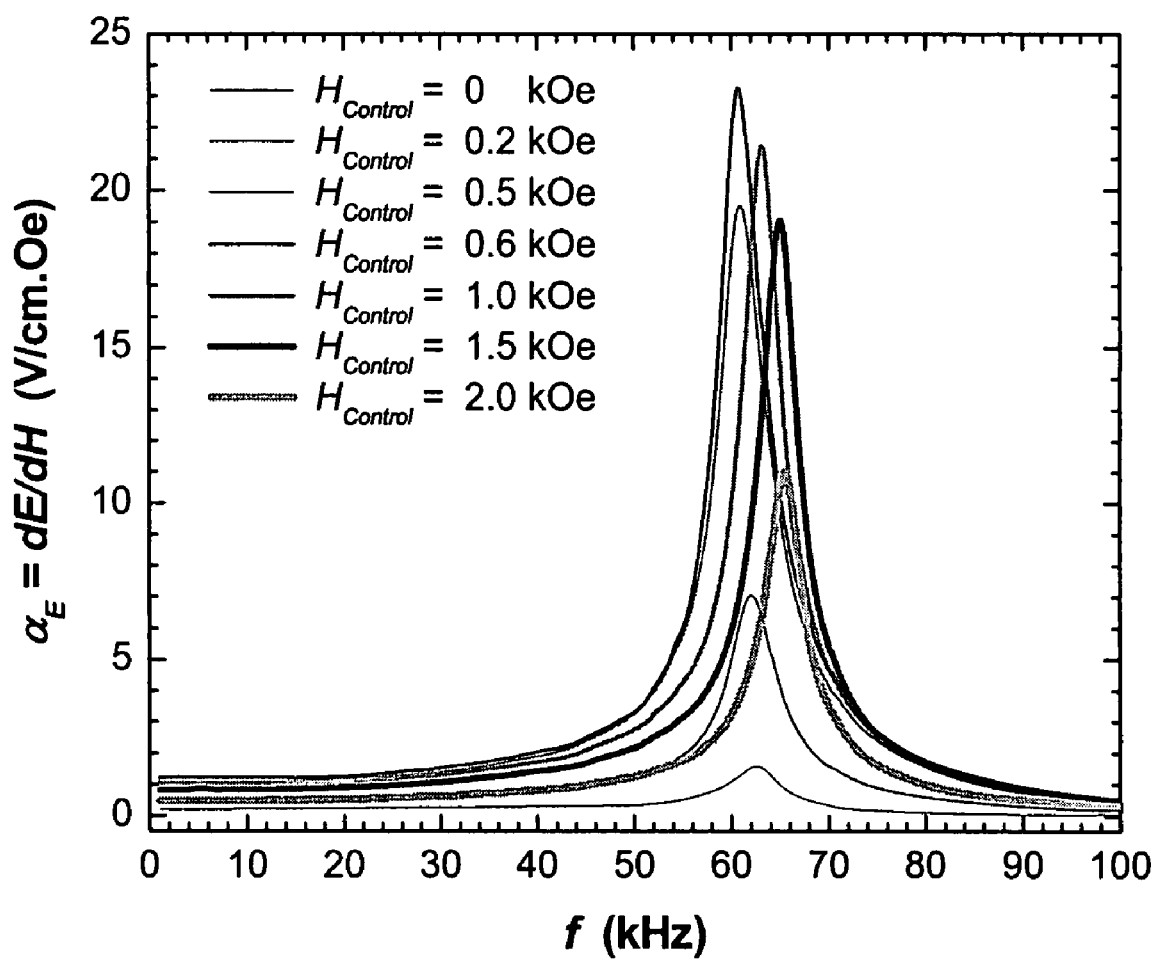
FIG. 7 shows a plot of magnetoelectric voltage coefficient $\alpha_E$ against frequency f at various magnetic control fields $H_{Control}$ for an embodiment of the present invention made using Terfenol-D/epoxy pseudo 1-3 magnetostrictive composite and PVDF piezoelectric polymer with a configuration as shown in FIG. 3d.

FIG. 7 is a plot of magnetoelectric voltage coefficient $\alpha_E$ against frequency f at various magnetic control fields $H_{Control}$ for an embodiment of the present invention made using Terfenol-D/epoxy pseudo 1-3 magnetostrictive composite and PVDF piezoelectric polymer with a configuration as shown in FIG. 3d. Surprisingly, it is found that the conversion efficiency (i.e., $\alpha_E$) is in the order of V/cm·Oe, and varies in accordance with $H_{Control}$. The variation in $\alpha_E$ is more significant at resonance in comparison with that at non-resonance. Apart from this resonance, the frequency response for $\alpha_E$ is essentially flat over the measured frequency range with no observable eddy-current losses. This indicates that this single device is capable of providing dual function ability (i.e., combo mode) of using as a sensor for detection and measurement of magnetic fields and electric currents when operating in its non-resonance region (FIG. 4) and as a "tunable" transducer (i.e., resonators, filters, switches, etc.) for mutual-controlling its input and output magnetic and electric field signals when operating in its resonance region (FIG. 5). The fundamental resonance frequency of the device as described above varies from 45 to 85 kHz, with a significant resonance at about 60 to 70 kHz, depending on the magnitude of $H_{Control}$. It should be understood that the resonance frequency illustrated in FIG. 7 is just an example; based on the same magnetostrictive and piezoelectric phases, this resonance frequency can be designed to appear at higher or lower frequencies by changing either the volume fractions of the constituent phases or the dimensions of the resulting magnetoelectric element.

Figure 8:
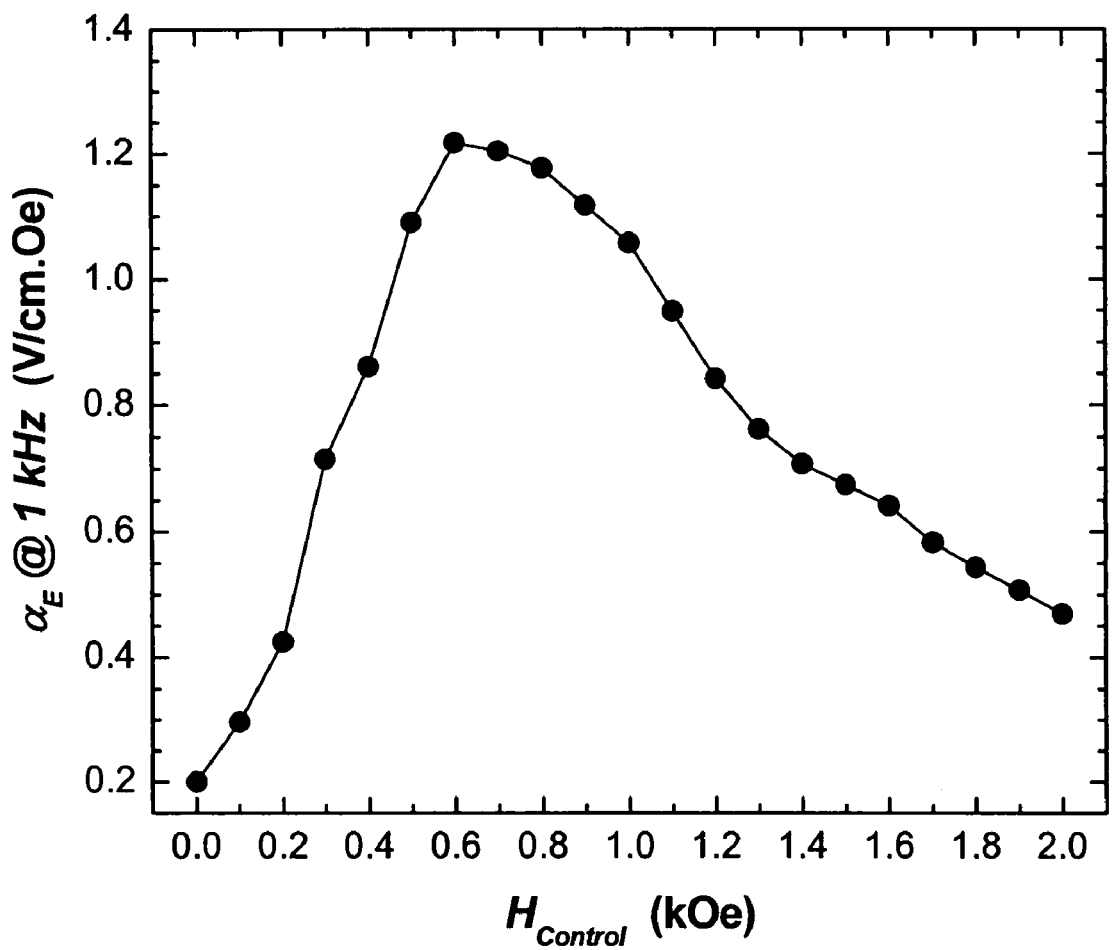
FIG. 8 shows a plot of magnetoelectric voltage coefficient $\alpha_E$ against magnetic control field $H_{Control}$ measured at 1 kHz for the magnetoelectric device of FIG. 7.

FIG. 8 is a plot of magnetoelectric voltage coefficient $\alpha_E$ against magnetic control field $H_{Control}$ measured at 1 kHz for the magnetoelectric device of FIG. 7. $\alpha_E$ at 1 kHz increases initially up to a maximum value near 0.6 kOe and then decreases with increasing $H_{Control}$. This suggests that a magnetic field (i.e., a fixed dc magnetic field) of 0.6 kOe (i.e., provided by the invariable field generator as shown in FIG. 4 for example) may be used to operate the device as a sensor with the maximum sensitivity.

Figure 9:
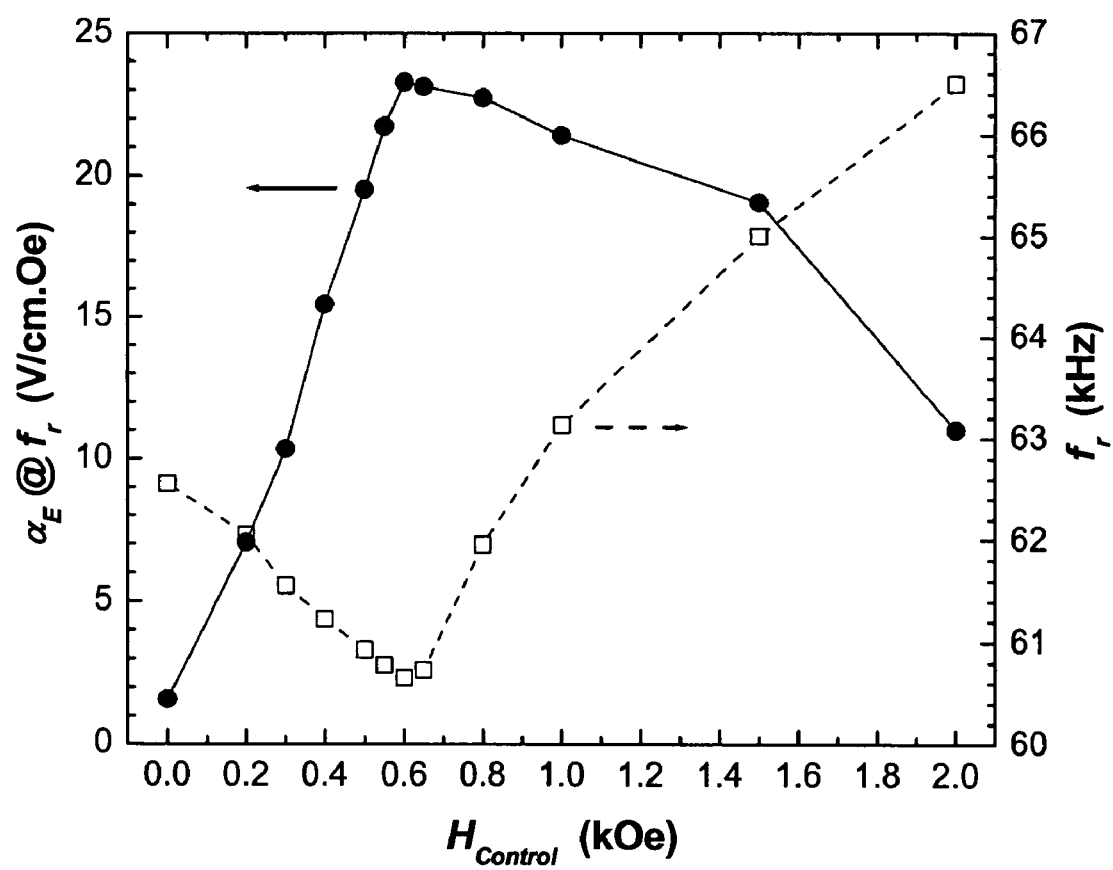
FIG. 9 shows a plot of resonance magnetoelectric voltage coefficient $\alpha_E$ @ $f_r$ and resonance frequency $f_r$ against magnetic control field $H_{Control}$ for the magnetoelectric device of FIG. 7.

FIG. 9 is a plot of resonance magnetoelectric voltage coefficient $\alpha_E$ @ $f_r$ and resonance frequency $f_r$ against magnetic control field $H_{Control}$ for the magnetoelectric device of FIG. 7. Significant change in conversion efficiency (i.e., $\alpha_E$) and significant shift in $f_r$ with respect to $H_{Control}$ are shown, reflecting the highly tunable nature of the device.

Figure 10:
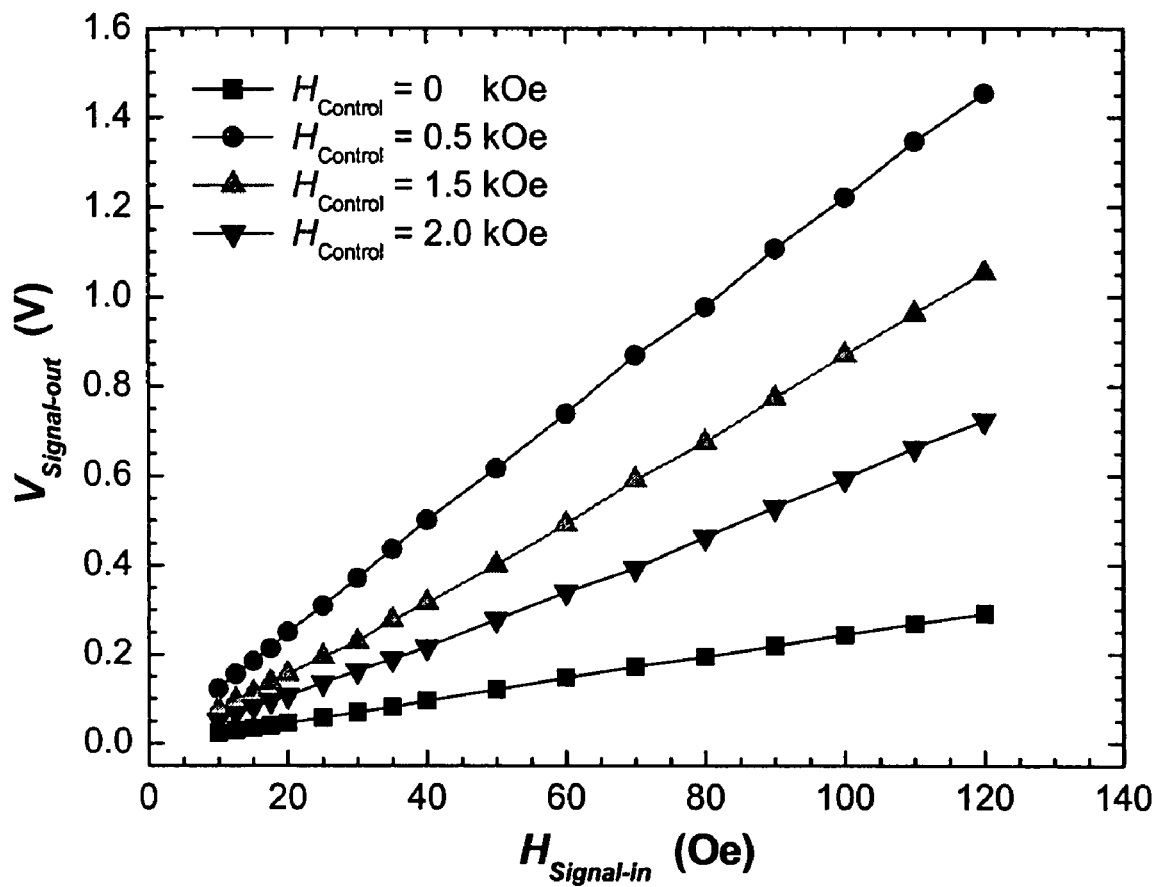
FIG. 10 shows a plot of magnetoelectric voltage signal output $V_{Signal-out}$ against magnetic field signal input $H_{Signal-in}$ at various magnetic control fields $H_{Control}$ for the magnetoelectric device of FIG. 7.

FIG. 10 is a plot of magnetoelectric voltage signal output $V_{Signal-out}$ against magnetic field signal input $H_{Signal-in}$ at various magnetic control fields $H_{Control}$ for the magnetoelectric device of FIG. 7. $V_{Signal-out}$ is a linear function of $H_{Signal-in}$ for all $H_{Control}$, indicating a practical device performance in terms of a large linearity and a large dynamic range of field detection.

While the preferred embodiment of the present invention has been described in detail by the examples, it is apparent that modifications and adaptations of the present invention will occur to those skilled in the art. Furthermore, the embodiments of the present invention shall not be interpreted to be restricted by the examples or figures only. It is to be expressly understood, however, that such modifications and adaptations are within the scope of the present invention, as set forth in the following claims. For instance, features illustrated or described as part of one embodiment can be used on another embodiment to yield a still further embodiment. Thus, it is intended that the present invention cover such modifications and variations as come within the scope of the claims and their equivalents.

The invention claimed is:

1. A method of controlling at least the magnetoelectric voltage coefficient $\alpha_E$ of a magnetoelectric device including a magnetoelectric element, said magnetoelectric element including at least one set of a piezoelectric layer and a magnetostrictive composite layer, wherein:
   the magnetostrictive composite layer includes at least one magnetostrictive material dispersed in first concentrated zones within a first polymer matrix, wherein all of said concentrated zones are orientated along a first direction; and
   positioned in a magnetic field generated by a variable field generator including the step of varying the magnetic field.

2. The method of claim 1, wherein the magnetoelectric device has a resonance frequency region, and the magnetic field is varied within the resonance frequency region.

3. The method of claim 1, wherein the resonance frequency region is about 45 to 85 kHz.

* * * * *